(12) United States Patent
Knöll et al.

(10) Patent No.: US 8,545,661 B2
(45) Date of Patent: Oct. 1, 2013

(54) MANUFACTURE OF ORGANICALLY DEVELOPABLE, PHOTOPOLYMERIZABLE FLEXO-GRAPHIC ELEMENTS ON FLEXIBLE METALLIC SUPPORTS

(75) Inventors: Rolf Knöll, Weinheim (DE); Thomas Telser, Weinheim (DE); Hans Menn, Willstätt (DE)

(73) Assignee: XSYS Print Solutions Deutschland, GmbH, Stuttgart (DE)

( * ) Notice: Subject to any disclaimer, the term of this patent is extended or adjusted under 35 U.S.C. 154(b) by 1550 days.

(21) Appl. No.: 11/332,240

(22) Filed: Jan. 17, 2006

(65) Prior Publication Data
US 2006/0118231 A1 Jun. 8, 2006

Related U.S. Application Data

(62) Division of application No. 10/343,927, filed as application No. PCT/EP01/09435 on Aug. 16, 2001.

(30) Foreign Application Priority Data

Aug. 18, 2000 (DE) .................................. 10 040 929

(51) Int. Cl.
*G03C 5/18* (2006.01)
*B32B 15/04* (2006.01)
*B32B 37/16* (2006.01)
*B29C 47/00* (2006.01)

(52) U.S. Cl.
USPC ...... 156/231; 156/241; 156/244.11; 156/247; 156/307.5; 430/269; 430/300; 430/302

(58) Field of Classification Search
None
See application file for complete search history.

(56) References Cited

U.S. PATENT DOCUMENTS

| 3,948,666 | A | | 4/1976 | Kitanishi et al. |
| 4,060,656 | A | | 11/1977 | Naka et al. |
| 4,355,093 | A | * | 10/1982 | Hartmann et al. ......... 430/275.1 |
| 4,357,414 | A | | 11/1982 | Hartmann et al. |
| 4,387,157 | A | | 6/1983 | Bronstert et al. |
| 4,427,759 | A | | 1/1984 | Gruetzmacher et al. |
| 4,925,769 | A | | 5/1990 | Huemmer et al. |
| 4,960,673 | A | | 10/1990 | Beck et al. |
| 5,026,742 | A | * | 6/1991 | Rehmer ..................... 522/116 |
| 5,135,827 | A | | 8/1992 | Bohm et al. |
| 5,135,837 | A | | 8/1992 | Swatton |
| 5,250,390 | A | * | 10/1993 | Gries ........................ 430/283.1 |
| 5,356,751 | A | | 10/1994 | Cairncross et al. |
| 6,020,108 | A | * | 2/2000 | Goffing et al. ............... 430/306 |
| 6,103,451 | A | | 8/2000 | Blum et al. |
| 6,238,837 | B1 | | 5/2001 | Fan |
| 2001/0044076 | A1 | | 11/2001 | Hiller |

FOREIGN PATENT DOCUMENTS

| DE | 2 414 596 | | 10/1974 |
| DE | 24 15 728 | | 1/1975 |
| DE | 30 15 340 | A1 | 10/1981 |
| DE | 30 45 516 | A1 | 7/1982 |
| EP | 038 477 | A1 | 10/1981 |
| EP | 0 053 260 | | 6/1982 |
| EP | 0 332 983 | A2 | 9/1989 |
| EP | 0 333 012 | A1 | 9/1989 |
| EP | 0 474 178 | A1 | 3/1992 |
| EP | 0 907 110 | A2 | 4/1999 |
| EP | 0 992 849 | A1 | 4/2000 |
| EP | 1 136 254 | | 9/2001 |

OTHER PUBLICATIONS

Print it Nr. Jun. 2, 1999, BASF Drucksysteme, S. 12-13 (No. U.S.).
Nylocat LA 116 (BASF), Cyrel CLAM (DuPont).
Inline-Veredelung ueber Flexo-Lackwerke, Deutcshe Drucker Nr. 29, 1999, pp. w2-w6.
Technik des Flexodrucks, Druckformen im Flexodruck, Coatings Verlag, 1999, pp. 148 ff.

* cited by examiner

*Primary Examiner* — Barbara J Musser
(74) *Attorney, Agent, or Firm* — Novak Druce Connolly Bove & Quigg LLP

(57) ABSTRACT

A process for the manufacture of organically developable, photopolymerizable flexographic elements on flexible metallic supports by coating a flexible metallic support with a tack-free adhesive coating composition which is insoluble and non-swelling in printing inks and organic developers, attaching an elastomeric, photopolymerizable layer to a protective film, and laminating the photopolymerizable layer to the metallic support coated with said adhesive coating composition. A photopolymerizable flexographic element comprising a photopolymerizable layer which is attached to a metallic support by means of a tack-free adhesive film that is non-swelling and insoluble in printing inks and organic developers.

14 Claims, No Drawings

MANUFACTURE OF ORGANICALLY DEVELOPABLE, PHOTOPOLYMERIZABLE FLEXO-GRAPHIC ELEMENTS ON FLEXIBLE METALLIC SUPPORTS

This is a divisional of application Ser. No. 10/343,927 filed Feb. 6, 2003 now U.S. Pat. 7,033,724, which is the National Stage of International Application PCT/EP01/09435, filed Aug. 16, 2001, now pending, the entire specification of which is hereby incorporated by reference.

The invention relates to a process for the manufacture of organically developable, photopolymerizable flexographic elements on flexible metallic supports. The invention also relates to organically developable, photopolymerizable flexographic elements on flexible metallic supports in which the photopolymerizable layer is attached to the metallic support by means of a tack-free adhesive film that is non-swelling and insoluble in printing inks and organic developers. The invention also relates to an organically developable, photopolymerizable flexographic element comprising a photopolymerizable layer which is attached to a flexible metallic support by means of an adhesive film which is non-swelling and insoluble in printing inks and organic developers.

BACKGROUND OF THE INVENTION

Photopolymerizable flexographic elements for the manufacture of flexographic printing plates usually consist of a flexible substrate, an adhesive layer, a photopolymerizable layer, a release layer and also a protective film for the photopolymerizable layer, which is removed prior to exposure to light. The supports used in commercial flexographic elements are usually PET films.

Perfectly registered set-up of PET-supported flexographic printing plates on the impression cylinder is usually effected using double-sided adhesive tape. Usually the flexographic printing plates are mounted outside the printing press on the dismantled impression cylinder, for which purpose frequently special mounting equipment is used. The impression cylinder thus provided with the plates is then remounted in the printing press. If it is neessary to correct the position of the flexographic plate, the impression cylinder to which it is stuck must be again dismantled from the printing press and the flexographic plate unstuck. Then a new piece of double-sided adhesive tape is stuck to the impression cylinder, onto which the flexographic plate is restuck, and the impression cylinder is again remounted in the press. This, however, is a complicated and time-consuming procedure.

In the prior art, water-developable, photopolymerizable high-pressure plates are laminated to PET supports or metallic supports of aluminum or steel. To ensure good adhesion of the photo-polymerizable layer on metallic supports, used can be made, for example, of a combination of two adhesive layers comprising a prime coating and an intermediate layer. For examples of this usage reference is made to DE-A 3,045,516 or EP-A 333,012. Printing plates on thin metallic supports are much easier to mount on impression cylinders. Attainment of perfect registration is further alleviated by providing high-pressure plates with a thin support of magnetizable steel, in known manner, (Print-it No. 2, June 1999, BASF Drucksysteme GmbH, page 12-13). Such high-pressure plates can be simply and quickly mounted on magnetic impression cylinders, in perfect registration.

Flexographic printing plates on metallic supports are well known. Patents or patent applications relating to flexographic printing plates frequently mention, in the description, that metals, as a general class, are suitable for use as materials for the supports. Reference is made here, by way of example, to EP-A 992,849 (section [0030]) and EP-A 474,178 (page 3, lines 50-54).

However, the working examples of such patents or patent applications usually illustrate the use of flexographic elements supported by only polymer films, particularly PET films. Only EP-A 332,983 gives working examples of flexographic printing plates on metallic supports. However, the flexographic element disclosed in said reference is not an organically developable element based on thermoplastic elastomeric block copolymers but a water-developable element based on specific polyvinylalcohol derivatives, as binding agents. Such binding agents are taken from high-pressure plate technology, and such flexographic printing plates can only be used with UV inks. No organically developable flexographic printing plates on flexible metallic supports are as yet commercially available.

Hitherto only photopolymerizable flexographic elements on a double support of PET film and an aluminum sheet (eg Nylocoat® LA 116 (BASF), Cyrel® CLAM (Du Pont)) have been commercially available. These plates comprise a photopolymeric layer which is not directly attached to the aluminum support, but they are conventional flexographic printing plates supported on a PET film, which is stuck to an additional aluminum support by means of, say, double-sided adhesive tape. This requires an additional process step, which is very time-consuming and labor-intensive. There is also the risk that when the plate is being developed the washout agent may cause the adhesive tape to lift from the aluminum support. Moreover, the interlayer adhesion between the PET film and the aluminum sheet can break during the printing process due to mechanical stresses. Since the loss of adhesion can alter the register, it is an exceptionally undesirable effect.

The flexographic printing plates on double PET/aluminum supports described therein are mainly used for upgrading products of sheet-fed offset machines, for example by lacquering or gold printing (cf eg "Inlineveredelung ueber Flexolackierwerke", published by Deutscher Drucker 29 (1999) w2 - w6). Flexographic printing plates used for this purpose are therefore also referred to as coating plates. In this field particular importance is attached to accuracy of register. Modern flexocoating machines in sheet-fed offset machines are frequently equipped with quick-action clamping bars or with fully automatic plate draw-in devices only suitable for drawing in printing plates having an aluminum support. Customers in offset printshops prefer flexographic printing plates on double PET/aluminum supports by reason of their distinctly higher dimensional stability as opposed to flexographic printing plates on film supports. In production printing, aluminum is distinctly more resilient to mechanical stresses than polyester. Even in the case of repeat orders involving repeated clamping and unclamping, the dimensional stability of the printing plates on aluminum supports is assured.

In view of the many advantages of flexographic printing plates on metallic supports, it would be desirable to apply the elastomeric photopolymerizable layer directly to the metallic support, in order to avoid the aforementioned complicated and elaborate manufacturing process.

In practice, however, the skilled person wishing to use metallic supports for flexographic printing plates faces a number of problems.

Photopolymerizable flexographic elements are usually prepared by melt extrusion. The photopolymeric composition is discharged through a slot die in between a protective film and a supporting PET film and the resulting composite is calendered. However, this technique cannot be simply transferred to supporting foils. Apart from the fact that it is industrially very exacting to carry out calendering on a metallic support, there is primarily the problem of corrugation. Due to their different coefficients of thermal expansion the metallic support and the protective film show different degrees of shrinkage when the melt-extruded photopolymeric composition is cooled. The difference in the shrinking behavior of the metallic support and the protective film leads to warping of the flexographic element, which is manifested by corrugation. Such flexographic elements cannot be used by reason of their high thickness tolerances.

The first step in the manufacture of flexographic printing plates of photopolymerizable flexographic elements is usually a so-called back exposure through the transparent supporting PET film. This serves inter alia to establish the relief depth and also to ensure that the individual halftone dots are firmly fixed to the substrate. The back exposure first of all causes a portion of the photopolymerizable layer to be completely polymerized, namely the lower region in contact with the supporting film. The upper portion of the layer remains unpolymerized at this stage. The upper portion is then converted to the actual printing relief in a second process step by front imaging. Thus the individual halftone dots of the flexographic printing plate do not adhere to the supporting film itself but are located on a layer of polymerized material in full-surface adhesive contact with the supporting film. The back exposure method is illustrated for example in "Technik des Flexodrucks", pp 148 et seq, 4th Edition, 1999, Coating Verlag, St. Gallen, Switzerland. It is of course impossible to carry out any exposure through the back of a flexographic printing plate on a metallic support. Consequently, when the flexographic element is developed following front exposure through the negative the unpolymerized material of the unexposed regions is removed right down to the support. Thus there is the risk that particularly those individual halftone dots which have only a small base area and weak adhesion will be torn away from the support during development or during the printing operation.

DETAILED DESCRIPTION OF THE INVENTION

It is thus an object of the invention to provide a simple and cost-effective process for the manufacture of organically developable flexographic printing plates on metallic supports.

Accordingly, we have found a process for the manufacture of organically developable, photopolymerizable flexographic elements on flexible metallic supports by coating a flexible metallic support with a tack-free adhesive layer which is non-swelling and insoluble in printing inks and organic developers, applying an elastomeric, photopolymerizable layer to a protective film, and laminating the photopolymerizable layer to the metallic support coated with said adhesive layer.

In another embodiment of the invention we have found a process for the manufacture of organically developable, photopolymerizable flexographic elements on flexible metallic supports for making flexographic printing plates by coating a flexible, metallic support with a tack-free adhesive layer which is non-swelling and insoluble in printing inks and organic developers, melt extruding an organically developable, elastomeric photopolymerizable composition and discharging it through a slot die in between a protective film or protective element and a temporary supporting film, and then calendering the composite, peeling off the temporary supporting film, laminating the photopolymerizable layer on its side remote from the protective film to the flexible metallic support coated with the adhesive layer.

We have also found an organically developable, photopolymerizable flexographic element composed of a photopolymerizable layer which is applied to a flexible metallic support by means of a tack-free adhesive layer which is non-swelling and insoluble in printing inks and organic developers.

The following statements serve to describe the process of the invention in more detail.

The metallic supports used for the flexographic elements are flexible. For the purposes of the invention, "flexible" should be taken to mean that the supports are thin enough to be bent around impression cylinders. On the other hand they are dimensionally stable and thick enough not to be buckled during production of the flexographic element or when the finished printing plate is mounted on the impression cylinder.

Suitable flexible metallic supports are primarily hin sheetsor metal foils of steel, preferably stainless steel, magnetizable spring steel, aluminum, zinc, magnesium, nickel, chromium or copper, these metals being alloyed if desired. Alternatively, use can be made of combined metallic supports such as steel plates coated with tin, zinc, chromium, aluminum, nickel or combinations of various metals, or alternatively metal supports obtained by laminating metal sheets of the same or different types. Furthermore, pretreated metal sheets, such as coslettized or chromatized steel sheeting or anodized aluminum sheets, may alternatively be used. The sheets or foils are usually degreased prior to use. Preferably use is made of supports of steel or aluminum and more preferably of magnetizable spring steel.

The thickness of such flexible metallic supports is usually between 0.025 mm and 0.4 mm, and is governed by the desired degree of flexibility and also the type of metal used. Supports of steel usually have a thickness ranging from 0.025 to 0.25 mm and preferably from 0.14 to 0.24 mm. Supports of aluminum usually have a thickness ranging from 0.25 to 0.4 mm.

The flexible metallic support is provided with a tack-free adhesive layer which is non-swelling and insoluble in printing inks and organic developers. The adhesive layer serves to provide good adhesion between the flexible metallic support and the photopolymerizable layer to be later applied thereto, so that the printing elements obtained by imaging the photopolymerizable layer are not torn off or broken off, or do not detach themselves, from the substrate when the plate is being developed or during printing.

The surface of the adhesive layer is tack-free. The degree of nontackiness can be assessed qualitatively by the person skilled in the art by feeling the layer, or determined quantitatively for example by taking pendulum tack readings. Furthermore, the adhesive layer is insoluble and non-swelling in conventional organic developers used for flexographic elements and also in conventional organic solvents or organic component-containing solvents in printing inks. Typical organic developing agents for flexographic elements comprise for example carboxylates, hydrogenated petroleum fractions or terpenes in admixture with alcohols. Reference is made for example to the publications EP-A 332,070, EP-A 15 463,486, EP-A 28,676, EP-A 433,374 or WO 93/10484. Typical solvents for flexographic inks comprise for example alcohols, such as ethanol or isopropanol, optionally in admixture with water.

Theoretically, any type of adhesive layer can be used in execution of the present process, provided that the aforementioned minimum requirements are satisfied.

An example of a suitable adhesive layer for execution of the process of the invention has been found to be one which comprises a binding agent which is embedded in a suitable polymer matrix. Discrete domains of elastomeric binding agent and matrix can usually be seen under the microscope.

Examples of suitable binding agents for use in the adhesive layer comprise elastomeric or elastothermoplastic polymers, such as are also usually employed for the manufacture of relief printing plates, such as polymers or copolymers of 1,3-dienes or SIS or SBS blockcopolymers. Alternatively, mixtures of two or more different elastomeric binding agents may are used.

The amount of elastomeric binding agent in the adhesive layer is determined by the person skilled in the art in accordance with the properties desired. It is usually from 10 to 70 wt %, based on the total components of the adhesive layer, particularly from 10 to 45 wt % and more particularly from 15 to 35 wt %. The polymer matrix is usually a crosslinked polymer matrix obtained by means of a suitable crosslinking system. The cross-linked polymer matrix can be obtained thermally by polycondensation or polyaddition of suitable monomers or oligomers, for example by the reaction of polyurethanes and suitable hydroxyl group-containing compounds such as hydroxyl group-containing polyurethane resins or polyester resins to form crosslinked polyurethanes.

Another suitable adhesive layer has been found to be one based on modified polyvinyl alcohols containing radically crosslinkable side-groups. This embodiment of the adhesive layer comprises a partially saponified polyvinyl alcohol which has been esterified by methacrylic anhydride. The proportion of radically crosslinkable methacrylate groups is from 1 to 10 mol % and preferably from 3 to 5 mol %. The adhesive layer further comprises bis(N-methylolacrylamide) ethylene glycol ether and a dialdehyde.

The adhesive layers may also contain further components and auxiliaries such as additional binding agents for influencing the properties, dyes, pigments or plasticizers.

When executing the process of the invention, it has been found to be particularly advantageous to add a migration-stable ultraviolet absorber to the adhesive layer. In this way backscattering of UV light through the metallic support during imaging of the flexographic element is prevented or at least greatly reduced. Such back-scattered light can lead to unwanted polymerization in areas of the photopolymerizable layer where absolutely no polymerization should take place.

The addition of migration-stable ultraviolet absorbers to the adhesive layer advantageously increases the exposure latitude of the flexographic elements. Furthermore the bases of the individual halftone dots become more slender, so that the dot gain of the finished flexographic printing plate during printing is less than when no such ultraviolet absorber is added. The migration-stable ultraviolet absorbers used can be primarily ultraviolet-absorbing substances such as exhibit a high molecular weight and show only a low tendency to migrate. Particularly advantageous are ultraviolet absorbers having reactive groups, so that they can be chemically embedded in the polymer matrix. An example thereof is a hydroxyl group-substituted Michler's ketone, which can be embedded in a polyurethane matrix.

Manufacture of the adhesive layer is usually carried out by dissolving the components of the adhesive layer in suitable solvents, mixing them vigorously, filtering the solution if necessary and applying the mixture to the flexible metallic supports. Application is preferably carried out using a flow coater, the thickness of the coating being controlled by varying the gap-width of the coating nozzle. Following application, the solvent is evaporated off. In the case of thermal systems, crosslinking is achieved by heating for a short period. In the case of photochemical systems, crosslinking is effected after evaporation of the solvent by UV irradiation. The residual solvent content in the layer should be below 5 wt % based on all components of the layer.

The thickness of the adhesive layer is usually from 5 to 100 µm, preferably from 10 to 50 µm and more preferably from 15 to 30 µm.

Alternatively, use can be made of a number of superimposed adhesive layers of the same, approximately the same, or different, compositions.

Another process step comprises the production of an elastomeric, organically developable, photopolymerizable layer for the flexographic element comprising at least one elastothermoplastic binding agent, one or more ethylenically unsaturated monomers, at least one photoinitiator or photoinitiator system and, optionally, other components such as plasticizers, inhibitors for thermally initiated polymerization, dyes, pigments, phototropic additives, antioxidants, other binding agents or extrusion aids. Particularly suitable elastothermoplastic binding agents are the conventional SIS- or SBS-type triblock copolymers. Such compositions for the manufacture of organically developable, photopolymerizable flexographic elements are well known to the person skilled in the art and are disclosed for example in DE-A 2,215,090, EP-A 084,851, EP-A 819,984 or EP-A 553,662. From the possible components and their proportions the person skilled in the art will make a suitable selection governed by the desired properties of the flexographic element or the flexographic printing plate.

The photopolymerizable layer can be made, for example, by pouring or melt extrusion. The thickness of the photopolymerizable layer can be varied by the person skilled in the art according to the desired properties of the printing forme. A thickness between 0.5 mm and 1.5 mm has proven successful for flexographic elements on flexible metallic supports.

Manufacture by pouring involves the dissolution of all components of the photopolymerizable layer in a suitable solvent to give a clear solution, which is then poured onto a protective film or protective element followed by evaporation of the solvent. The said film serves as a substrate for the photopolymerizable layer during the pouring operation and later functions as a protective film for the finished flexographic element. The protective film prevents the photopolymerizable flexographic element from being damaged during storage or transfer and must be peeled off prior to imaging of the element. The residual solvent content of the layer should be as low as possible, in order to avoid the formation of bubbles or blisters due to slow evaporating of residual solvent. Usually the residual solvent content of the photopolymerizable layer should be less than 5 wt % based on the sum of all components of the layer. The residual solvent content is preferably less than 3 wt %.

The protective film used is usually a PET film, which may be modified, for example siliconized. Alternatively, protective elements may be used which comprise further layers in addition to the protective film.

An example of another such layer is a release layer located between the photopolymerizable layer and the protective film and soluble in the developing agent for the photopolymerizable layer. It frequently consists of suitable polyamides and facilitates stripping of the protective film prior to using the flexographic element and also facilitates positioning of the photographic negative for imaging.

Another example is a comparatively thin, photopolymerizable, top layer located over the photopolymerizable layer. Such a top layer is disclosed for example in EP-A 084,851. This two-layer arrangement has the advantage that the properties of the surface of the printing forme, such as ink transfer, can be changed without influencing the flexotypical properties of the printing forme, such as hardness or elasticity. Thus surface properties and layer properties can be modified independently in order to acquire optimum printing results.

An IR-ablative layer is another example. This can be on the photopolymerizable layer or alternatively on the top layer, if present. Such layers usually comprise at least one binding agent and carbon black. They serve to enable direct digital imaging of the photopolymerizable flexographic element by means of an IR laser. Examples of such layers are given in EP-A 767,407 or EP-A 654,150.

The cast elastomeric photopolymerizable layer is placed with its side remote from the protective film or element against the adhesive coating on the flexible metallic support and is laminated to said support. A particularly suitable laminating solvent for the photopolymerizable layer containing elastothermoplastic binding agents is toluene. However, lamination can be effected without any solvent, for example by heating (thermal lamination). To this end the elastomeric, photopolymerizable layer is heated to a temperature ranging from 500 to 100° C., preferably from 600 to 80° C., shortly before entering the calender nip either by means of a stream of hot-air or alternatively with the aid of an infra-red radiator (eg Heraeus). Both solvent lamination and thermal lamination serve to increase the degree of adhesion to the metallic support. In another embodiment of the process of the invention the photopolymerizable layer is made in known manner by melt extruding the composition described above, discharging it through a slot die in between a protective film or element and a temporary supporting film, after which the composite formed is calendered.

The temporary supporting film used may be, say, a PET film, which may be modified, eg siliconized, to facilitate subsequent removal thereof by peeling.

Further processing involves peeling the temporary supporting film from the photopolymerizable layer and then laminating the latter in the above manner to the flexible metallic support coated with the adhesive layer.

Manufacture of the photosensitive flexographic elements may also be effected by pouring a photosensitive layer directly onto the support coated with the adhesive layer, and then laminating the protective film or element thereto.

The photopolymerizable flexographic elements produced by the process of the invention on a metallic support exhibit excellent adhesion of the photopolymerizable layer to the metallic support. They can be used for making flexographic formes in known manner. The only difference is that the back exposure through the support, as conventionally carried out on flexographic elements on PET supports, is omitted. Making a flexographic forme can on the one hand involve, in classical manner, peeling the protective film, positioning a photographic negative, imaging with actinic light, developing, drying and, optionally, applying aftertreatment. Alternatively, it can be made using a digital imaging technique. To this end, a photopolymerizable flexographic element is used which has an IR-ablative layer. Making the flexographic forme then involves the steps of peeling off the protective film, imagesetting the IR-ablative layer, imaging with actinic light, developing, drying and, optionally, applying aftertreatment. Further details on both processes are known to the person skilled in the art and are disclosed for example in EP-A 992,849.

The adhesive layer used in the process of the invention causes, also under the influence of the organic developing agents in which the adhesive layer is neither capable of swelling nor soluble, an excellent degree of adhesion, so that even fine halftone dots are firmly fixed to the support, although the relief layer is completely removed in the unexposed regions, where the support carrying the adhesive layer becomes uncovered. Very little dust accumulates in the uncovered regions during printing. Interruptions of the printing process for removal of dust from the printing plate occur less frequently.

The fact that the metallic support coated in the manner herein proposed is free from tack contributes further to particularly economical production, for the support can be stacked or rolled up during production without sticking together and without any need for further measures, such as the insertion of paper to form an intermediate layer.

The following examples serve to illustrate the invention in greater detail without restricting the scope of the invention thereto.

Example 1

(a) Making the Adhesive Layer

There was prepared, with vigorous mixing, a mixture of an SBS block copolymer (Kraton D 4150, 19.5 wt %), an oligomeric polyurethane resin containing OH groups (NPP 262, 35 wt %), a copolyester (Vitel 3300, 35 wt %), an aromatic isocyanate (Desmodur L 67, 9.5 wt %) and an ultraviolet absorber (hydroxy Michler's ketone, 1 wt %) in THF, and this mixture was poured onto an aluminum support (thickness 0.3 mm), after which the solvents were evaporated and the residue crosslinked by heating to 170° C. for 2.5 min.

There was obtained an adhesive layer having a thickness of from 12 to 15 µm. Examination under the microscope revealed rubber particles of from 80 to 100 µm in diameter in a continuous matrix. The adhesive layer on the support was tack-free. The coated aluminum sheets could be stacked without sticking together.

(b) Making the photosensitive layer

The following components were used:

| Component | Quantity [wt %] |
| --- | --- |
| SBS rubber | 68 |
| plasticizer | 23 |
| monomer (hexanediol diacrylate) | 7 |
| photoinitiator, dyes | 2 |

The components were dissolved in toluene, poured onto a PET film provided with a release layer and dried at 75° C. The residual solvent content of the layer was 2 %.

(c) Laminating

The dried photosensitive layer was laminated to the aluminum sheet provided with the adhesive layer. Just before lamination, the dried photosensitive layer was heated to a temperature of ca 60° C. by means of hot air; a laminating solvent was not used.

(d) Further processing

Making the printing forme:

Following one week's storage the plates were processed to printing formes. The following processing steps were carried out:

a. removal of the PET film,
   b. positioning of a negative,
   c. main exposure under a vacuum bag (F III imager, BASF, 3-24 min at 3 minute intervals),
   d. plate washout (flowline system Combi LF II, BASF, flow rate 150 mm/min, organic washout agent (based on hydrocarbon solvents) Nylosolv® sold by BASF, 30° C., relief depth 1000 µm), e. drying at 65° C. over a period of 2 hours, f. re-exposure (UV-A, F III imager, BASF, 15 min),
g. posttreatment with UV-C radiation (F III detacker, BASF, 15 min).

The steps a. to g. correspond to conventional processing steps for flexographic printing plates on transparent PET supports except that the back exposure step was omitted. The test printing forme was evaluated. The plates were examined to determine the exposure time at which the positive test elements [freestanding dot 100 µm, screen 100 µm and the 3% halftone patch (24 L/cm)] were correctly formed on the printing plate. The exposure time required to assure correct formation of all of the positive elements is referred to as the lower exposure limit (LEL), ie the minimum exposure time for correct imaging.

Furthermore, the negative elements, ie the 500 µm negative dot and 2000 µm pit, were assessed. If the depth in the negative dot falls below 70 µm or in the pit below 500 µm, correct ink transfer is no longer guaranteed. The time at which at least one of the two negative elements falls below these limits is referred to as the upper exposure limit (UEL), ie maximum exposure time for an usable printing plate. The difference between UEL and LEL is the exposure latitude (EL), which must be positive for practical purposes.

The exposure latitude measured was +10 min and was thus positive.

The adhesion of the printing plates on the support was determined as follows: to determine the adhesion of the support layer a plate is first of all cut to give a piece measuring ca 10×20 cm, which is then fully exposed for at least 20 minutes over its entire area without the use of a vacuum bag. 2 samples measuring 20 cm×2 cm (±0.1 cm) are then cut off using gate shears. These strips must be cut exactly, as otherwise false measurement results may arise. Before the test strips can be clamped into the tension tester (Zwick) the relief layer of the samples must be manually peeled away from the support over a distance of ca 5 cm. The tension tester peels the relief layer from the support at an angle of 180° and measures the force necessary for this purpose in N/2 cm. The results are summarized in Table 1.

EXAMPLE 2

Example 1 was repeated except that a support of sheet steel (thickness 0.14 mm) was used. There was obtained an adhesive layer having a thickness of from 12 to 15 µm. Examination under the microscope revealed rubber particles of from 80 to 100 µm in diameter in a continuous matrix. The adhesive layer on the support was tack-free. The coated steel sheets could be stacked without sticking together. The degree of adherence was lower than that achieved on sheet aluminum, but was still sufficiently high to assure adequate adhesion in applications normally encountered in practice. The results are summarized in Table 1.

EXAMPLE 3

Example 2 was repeated except that an adhesive coating composition of polyvinyl alcohol, modified polyvinyl alcohol (ethylenically polymerizable side-groups), glyoxal and bis(N-methylolacrylamide)ethylene glycol ether was used. The adhesive coating composition was crosslinked by heating to 180° C. over a period of 2 minutes. The adhesive layer on the support was tack-free. The coated sheet steels could be stacked without sticking together. The degree of adherence on the sheet steel was excellent, the photosensitive layer could not be separated from the support. The results are summarized in Table 1.

Comparative Example 4

Use was made of an adhesive coating composition intended for water-developable high-pressure plates and comprising a polyamide and a phenolic resin, such as is described in DE-A 2,202,357. The adhesive layer on the support was tack-free. The coated steel sheets could be stacked without sticking together but the adherence was only 2.7 N/2 cm and thus inadequate for practical requirements. The results are summarized in Table 1.

COMPARATIVE EXAMPLE 5

Example 1 was repeated except that a conventional layer of adhesive polyurethane was used. In addition, prior to imaging through the photographic negative (steps b. and c. of the general instructions) a back exposure was carried out with actinic light passed through the PET support. The adherence of the relief layer on the support was good. The exposure properties were like those of the plates on metallic supports. The fact that no back exposure can take place in the process of the invention has no impairing effect on the properties.

The results are summarized in Table 1.

COMPARATIVE EXAMPLE 6

In a manner similar to that described in Example 1 there was prepared a mixture of an SBS block copolymer (Kraton D-KX222, 19.5 wt %), an oligomeric polyurethane resin containing hydroxyl groups (NPP 262, 35 wt %), an aromatic isocyanate (Desmodur L 67, 9.5 wt %) and an ultraviolet absorber (hydroxy Michler's ketone, 1 wt %). The copolyester IVitel 3300, 35 wt %) was replaced by a special adhesive resin (Regalit 5100, Hercules). The mixture was dissolved in THF and poured onto an aluminum support (thickness 0.3 mm), the solvent evaporated and the residue crosslinked by heating at 170° C. for 2.5 min. The adhesive layer was extremely sticky and the metal sheets could not be separated from each other in a stacking test. The results are summarized in Table 1.

TABLE 1

Results of Experiments and Comparative Examples.

| | Example 1 | Example 2 | Example 3 | Comp. Ex. 4 | Comp. Ex. 5 | Comp. Ex. 6 |
|---|---|---|---|---|---|---|
| Support | Aluminum | Steel | Steel | Steel | PET film | Aluminum |
| Adhesive coating composition | SBS/PU | SBS/PU | PVA | PA | PU | SBS/PU |
| Tack | tack-free | tack-free | tack-free | tack-free | tack-free | tacky |
| Plate adherence [N/2 cm] | >20 | 5.5 | >20 | 2.7 | >20 | 4.7 |
| Shore Hardness [° A] | 75 | 73 | 75 | 75 | 75 | 74 |
| LEL [min] | 6 | 6 | 6 | — | 6 | — |
| UEL [min] | 16 | 16 | 16 | — | 16 | — |
| EL [min] | 10 | 10 | 10 | — | 10 | — |
| Remarks | | | | inadequate adhesion | with back exposure | too tacky |

The invention claimed is:
1. A process for the manufacture of organically developable, photopolymerizable flexographic elements on flexible metallic supports for making flexographic printing plates, wherein the following steps are carried out:
- (a) coating a flexible metallic support with a tack-free adhesive layer which is insoluble and non-swelling in printing inks and organic developers which comprises a modified polyvinylalcohol containing radically crosslinkable side groups,
- (b) coating a protective film or a protective element with an organically developable, elastomeric, photopolymerizable layer by dissolution of (i) at least one thermoplastic elastomeric binder, said binder or binders consisting essentially of copolymers selected from the group consisting of SIS-triblock copolymers and SBS-triblock copolymers, (ii) ethylenically unsaturated monomers, (iii) photoinitiator or photoinitiator system and, optionally, (iv) other components in a suitable solvent, pouring the solution onto the protective film or the protective element and then evaporating the solvent,
- (c) laminating the elastomeric, photopolymerizable layer on its side remote from the protective film with the flexible metallic support coated with an adhesive layer.

2. A process as claimed in claim 1, wherein the flexible metallic support is a support comprising aluminum, steel or magnetizable spring steel.

3. A process as claimed in claim 1, wherein the photopolymerizable layer has a thickness of from 0.5 to 1.5 mm.

4. A process as claimed in claim 1, wherein the protective element comprises a protective film and an IR-ablative layer.

5. A process as claimed in claim 1, wherein the tack-free adhesive layer comprises a migration-stable UV absorber.

6. A process as claimed in claim 1, wherein the modified polyvinylalcohol is a partially saponified polyvinylalcohol which has been esterified with methacrylic anhydride.

7. A process as claimed in claim 6, wherein the modified polyvinylalcohol comprises from 1 to 10 mol % of crosslinkable methacrylate groups.

8. A process as claimed in claim 6, wherein the modified polyvinylalcohol comprises from 3 to 5 mol % of crosslinkable methacrylate groups.

9. A process for the manufacture of organically developable, photopolymerizable flexographic elements on flexible metallic supports for making flexographic printing plates, wherein the following steps are carried out:
- (a) coating a flexible metallic support with a tack-free adhesive layer which is insoluble and non-swelling in printing inks and organic developers which comprises a modified polyvinylalcohol containing radically crosslinkable side groups,
- (b) melt extruding an organically developable, elastomeric photopolymerizable composition at least comprising (i) a thermoplastic elastomeric binder, said binder or binders consisting essentially of copolymers selected from the group consisting of SIS-triblock copolymers and SBS-triblock copolymers, (ii) ethylenically unsaturated monomers, (iii) photoinitiator or photoinitiator system and, optionally, (iv) other components, discharging said composition through a slot die between a protective film or a protective element and a temporary supporting film, and then calendering the composite,
- (c) peeling off the temporary supporting film,
- (d) laminating the photopolymerizable layer on its side remote from the protective film with the flexible metallic support coated with the adhesive layer.

10. A process as claimed in claim 9, wherein the flexible metallic support is a support comprising aluminum, steel or magnetizable spring steel.

11. A process as claimed in claim 9, wherein the photopolymerizable layer has a thickness of from 0.5 to 1.5 mm.

12. A process as claimed in claim 9, wherein the protective element comprises a protective film and an IR-ablative layer.

13. A process as claimed in claim 9, wherein the tack-free adhesive layer comprises a migration-stable UV absorber.

14. A process for the manufacture of organically developable, photopolymerizable flexographic elements on flexible metallic supports for making flexographic printing plates, wherein the following steps are carried out:
- (a) coating a flexible metallic support with a tack-free adhesive layer which is insoluble and non-swelling in printing inks and organic developers which comprises a modified polvvinylalcohol containing radically crosslinkable side groups, wherein the adhesive layer further comprises bis(N-methylolacrylamide)ethylene glycol ether and a dialdehyde,
- (b) coating a protective film or a protective element with an organically developable, elastomeric, photopolymerizable layer by dissolution of (i) at least one thermoplastic elastomeric binder selected from the group consisting of SIS-triblock copolymers and SBS-triblock copolymers, (ii) ethylenically unsaturated monomers, (iii) photoinitiator or photoinitiator system and, optionally, (iv) other components in a suitable solvent, pouring the solution onto the protective film or the protective element and then evaporating the solvent,
- (c) laminating the elastomeric, photopolymerizable layer on its side remote from the protective film with the flexible metallic support coated with an adhesive layer.

* * * * *